United States Patent
Pringle et al.

(10) Patent No.: US 9,543,984 B2
(45) Date of Patent: Jan. 10, 2017

(54) EFFICIENT STORAGE ARCHITECTURE FOR LOW-DENSITY PARITY-CHECK DECODING

(71) Applicant: Infinera Corporation, Sunnyvale (CA)

(72) Inventors: Scott G. Pringle, Woodlawn (CA); Mehdi Karimi, Ottawa (CA); Sandy Thomson, Ottawa (CA); Yuejian Wu, Woodlawn (CA)

(73) Assignee: Infinera Corporation, Sunnyvale, CA (US)

( * ) Notice: Subject to any disclaimer, the term of this patent is extended or adjusted under 35 U.S.C. 154(b) by 46 days.

(21) Appl. No.: 14/319,503

(22) Filed: Jun. 30, 2014

(65) Prior Publication Data

US 2015/0311918 A1    Oct. 29, 2015

Related U.S. Application Data

(60) Provisional application No. 61/984,526, filed on Apr. 25, 2014.

(51) Int. Cl.
*H03M 13/00* (2006.01)
*H03M 13/11* (2006.01)
*H04L 1/00* (2006.01)

(52) U.S. Cl.
CPC ..... *H03M 13/1128* (2013.01); *H03M 13/1105* (2013.01); *H03M 13/1154* (2013.01); *H03M 13/6502* (2013.01); *H04L 1/0045* (2013.01)

(58) Field of Classification Search
CPC .... H04L 1/0045; H04L 1/0051; H04L 1/0057; H04L 1/0041; H03M 13/1128; H03M 13/114; H03M 13/1134; H03M 13/1154; H03M 13/1111; H03M 13/255; H03M 13/6527; H03M 13/6362; H03M 13/6502; H03M 13/23; H03M 13/112; H03M 13/1137; H03M 13/116

See application file for complete search history.

(56) References Cited

U.S. PATENT DOCUMENTS

2010/0153810 A1*  6/2010  Kamiya ............. H03M 13/1117
                                                                714/752

OTHER PUBLICATIONS

Daniel J. Costello, Jr. et al., "A Comparison Between LDPC Block and Convolutional Codes", In Proceedings of Information Theory and Applications Workshop, ,http://ita.ucsd.edu/workshop/06/papers/253.pdf, Feb. 6-10, 2006, 5 pages.

(Continued)

*Primary Examiner* — Guerrier Merant
(74) *Attorney, Agent, or Firm* — Harrity & Harrity LLP; David L. Soltz

(57) ABSTRACT

A low-density parity-check (LDPC) decoder may comprise a shift register configured to receive LDPC coded data, perform an iteration associated with decoding the LDPC coded data, and provide a result of performing the iteration. The shift register may include a quantity of lanes corresponding to a quantity of data words received by the shift register at a particular clock cycle, a quantity of stages corresponding to a quantity of clock cycles needed to perform the iteration, a quantity of storage elements, associated with storing the data words during the iteration, and a set of check node elements associated with updating the data words during the iteration. The quantity of stages times the quantity of lanes may be greater than the quantity of storage elements by a particular number of storage elements. The particular number of storage elements may be displaced by the set of check node elements.

20 Claims, 9 Drawing Sheets

(56) References Cited

OTHER PUBLICATIONS

Chiu-Wing Sham et al., "A 2.0 Gb/s Throughput Decoder for QC-LDPC Convolutional Codes", IEEE Transactions on Circuits and Systems I: Regular Papers, vol. 60, Issue 7, May 1, 2013, 12 pages.
Ali E. Pusane et al., "Deriving Good LDPC Convolutional Codes from LDPC Block Codes", IEEE Transactions on Information Theory, vol. 57, Issue 2, Dec. 1, 2010, 21 pages.
Ali E. Pusane et al., "Implementation Aspects of LDPC Convolutional Codes", IEEE Transactions on Communications, vol. 56, No. 7, Jul. 2008, 11 pages.
Massachusetts Institute of Technology, "Lecture 8 Convolutional Coding",http://web.mit.edu/6.02/www/s2010/handouts/lectures/L8-notes.pdf, Oct. 4, 2010, 8 pages.
Massachusetts Institutue of Technology, "Lecture 9 Viterbi Decoding of Convolutional Codes", http://web.mit.edu/6.02/www/f2010/handouts/lectures/L9.pdf, Oct. 6, 2010, 11 pages.
Bernhard M.J. Leiner, "LDPC Codes—a brief Tutorial", http://www.bernh.net/media/download/papers/ldpc.pdf, Apr. 8, 2005, 9 pages.
R. Michael Tanner et al., "LDPC Block and Convolutional Codes Based on Circulant Matrices", IEEE Transactions on Information Theory, vol. 50, No. 12, Dec. 2004.

\* cited by examiner

EFFICIENT STORAGE ARCHITECTURE FOR LOW-DENSITY PARITY-CHECK DECODING

RELATED APPLICATION

This application claims priority under 35 U.S.C. § 119 to U.S. Provisional Patent Application No. 61/984,526, filed on Apr. 25, 2014, the content of which is incorporated by reference herein in its entirety.

BACKGROUND

A low-density parity-check (LDPC) code is a linear error correcting code with a sparse parity-check matrix and a block length that may attain performance near the Shannon limit. The LDPC code may be constructed using a sparse bipartite graph. In some implementations, the LDPC code may be decoded using an iterative algorithm, such as a message passing algorithm, that allows information to be passed between storage elements and check node elements associated with decoding the LDPC coded data.

SUMMARY

According to some possible implementations, a low-density parity-check (LDPC) decoder, included in a receiver, may comprise a shift register configured to: receive LDPC coded data; perform an iteration associated with decoding the LDPC coded data; and provide a result of performing the iteration associated with decoding the LDPC coded data; where the shift register may include: a quantity of lanes corresponding to a quantity of data words received by the shift register at a particular clock cycle; a quantity of stages corresponding to a quantity of clock cycles needed to perform the iteration associated with decoding the LDPC coded data; and a quantity of storage elements, associated with storing the data words during the iteration, and a set of check node elements associated with updating the data words during the iteration, where a value of the quantity of stages times a value of the quantity of lanes may be greater than a value of the quantity of storage elements by a value representing a particular number of storage elements, and where the particular number of storage elements may be displaced by the set of check node elements.

According to some possible implementations, a low-density parity-check (LDPC) decoder may comprise a set of shift registers configured to: receive LDPC coded data; decode the LDPC coded data to create output data, where each shift register, of the set of shift registers, may perform at least one iteration associated with decoding the LDPC coded data; and provide the output data; where each shift register, of the set of the shift registers, may include: a quantity of lanes corresponding to a quantity of data words received by the shift register at a particular clock cycle; a quantity of stages corresponding to a quantity of clock cycles needed to perform an iteration associated with decoding the LDPC coded data; a quantity of storage elements, associated with storing the data words during the iteration, and a set of check node functions associated with updating data words during the iteration; where a value of the quantity of storage elements may be less than a value of the quantity of stages times a value the quantity of lanes by a value representing a particular number of storage elements, and where the particular number of storage elements may be displaced by the set of check node functions.

According to some possible implementations, an optical receiver, including a low-density parity-check (LDPC) decoder, may comprise a shift register configured to: receive LDPC coded data, perform an iteration associated with decoding the LDPC coded data; and provide a result associated with performing the iteration associated with decoding the LDPC coded data; where the shift register may include: a quantity of shift register lanes corresponding to a quantity of data words received by the shift register at a particular time, a quantity of shift register stages corresponding to a quantity of clock cycles associated with performing the iteration associated with decoding the LDPC coded data, and a quantity of storage elements, associated with storing the data words during the iteration, and a group of check node elements associated with updating the data words during the iteration, where a value representing the quantity of shift register stages times a value representing the quantity of shift register lanes may be greater than a value representing the quantity of storage elements by a value representing a particular number of storage elements, and where the particular number of storage elements may be displaced by the group of check node elements.

DETAILED DESCRIPTION

The following detailed description of example implementations refers to the accompanying drawings. The same reference numbers in different drawings may identify the same or similar elements. Additionally, while the systems and/or methods described herein are described in the example context of an optical communication network, these systems and/or methods may be equally applied in another context, such as a wireless communication network, a telecommunication network, or another type of communication network.

In order to achieve a high amount of throughput when implementing a low-density parity-check (LDPC) code, a great deal of parallelism between components of an LDPC decoder may be required. As such, traditional implementations of LDPC decoders (e.g., that include separate check node elements and storage elements within the LDPC decoder) may be impractical.

Implementations described herein provide an LDPC decoder using a group of shift registers (e.g., rather than separate check node elements and storage elements), such that a check node element, associated with implementing a check node function, may displace (i.e., replace the need for)

one or more storage elements associated with the LDPC coded data being updated by the check node element. In this manner, an amount of required data storage, a gate count, and/or an amount of power required by the LDPC decoder, when decoding the LDPC coded data, may be reduced (e.g., as compared to a traditional LDPC decoder).

Figure 1:
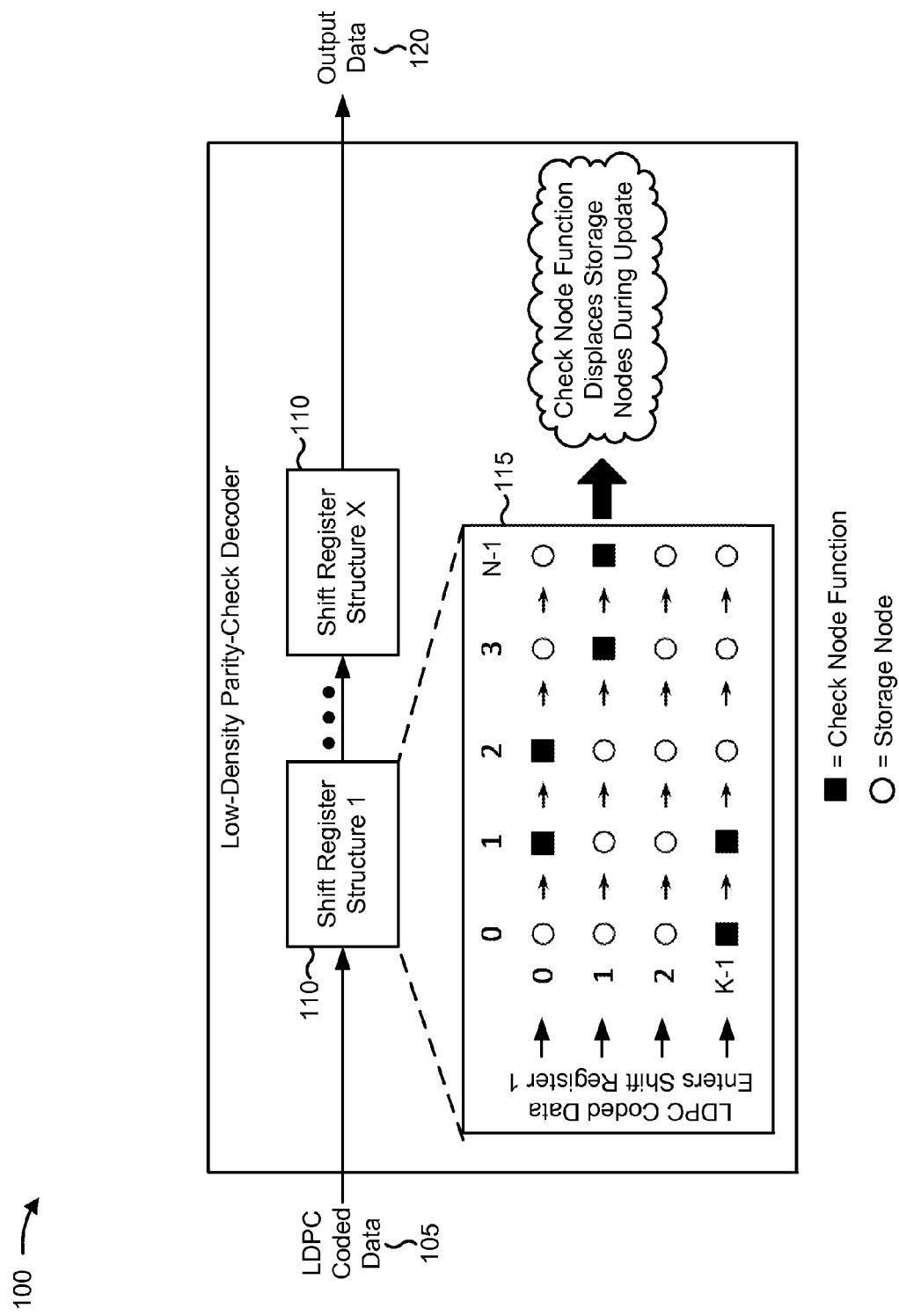
FIG. 1 is a diagram of an overview of an example implementation described herein.

FIG. 1 is a diagram of an overview of an example implementation 100 described herein. For the purposes of example implementation 100, assume that a receiver, included in a system (e.g., an optical communication system) includes an LDPC decoder, and that the receiver has received and processed LDPC coded data such that the LDPC coded data is to be provided to the LDPC decoder.

As shown in FIG. 1, and by reference number 105, the LDPC decoder may receive the LDPC coded data. As shown by reference number 110, the LDPC decoder may be implemented using a group of shift registers identified as shift register structure 1 through shift register structure X (e.g., rather than using separate storage elements and check node elements). In some implementations, each shift register structure may perform one iteration of decoding the LDPC coded data as the LDPC coded data passes through the shift register.

As shown by reference number 115, each shift register structure may include K lanes (e.g., lane 0 through lane K-1, corresponding to K data words associated with decoding the LDPC coded data), and N shift register stages (e.g., stage 0 through stage N-1, that allow a full iteration of decoding the LDPC coded data to be performed as the LDPC coded data passes through the shift register for a quantity of N clock cycles). As the LDPC coded data passes through the shift register each data word in each lane may be updated by a check node function associated with decoding the LDPC coded data.

For example, as a data word is passed from stage 0 of lane 0 to stage 1 of lane 0, the data word may be provided to a check node element (e.g., to allow a corresponding check node function to update the data word in accordance with the LDPC code). However, as shown, the check node element may require two clock cycles (e.g., comprising stage 1 and stage 2 to update the data word in lane 0) before providing the updated data word to the data node in stage 3 of lane 0 in the shift register. As such, 0 does not require storage elements in stage 1 or stage 2 of lane 0 since the check node element is, essentially, acting as a storage element for the lane 0 data during stage 1 and stage 2. Storage elements may be similarly displaced in other lanes and for other stages included in the shift register, and for multiple other shift registers.

In this way, an LDPC decoder may be implemented using a group of shift registers (e.g., rather than separate check node elements and storage elements), such that a check node element, associated with implementing a check node function, may displace one or more storage elements associated with the LDPC coded data being updated by the check node element. In this manner, an amount of required data storage, a gate count, and/or an amount of power required by the LDPC decoder may be reduced (e.g., as compared to a traditional LDPC decoder).

Figure 2:
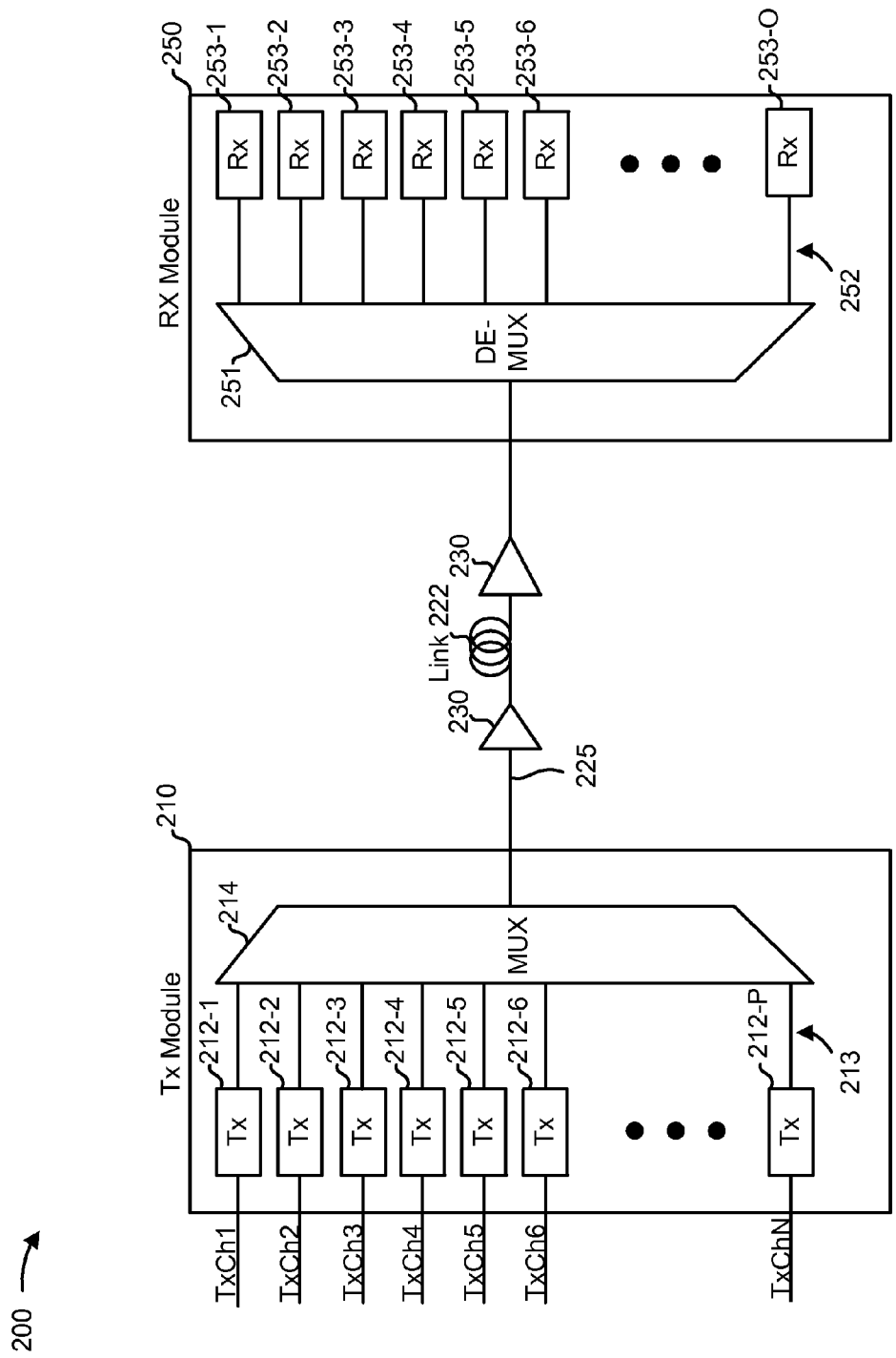
FIG. 2 is a diagram of an example network in which systems and/or methods, described herein, may be implemented.

FIG. 2 is a diagram of an example network 200 in which systems and/or methods described herein may be implemented. As shown in FIG. 2, a network may include transmitter module 210 (e.g., a Tx photonic integrated circuit (PIC)) and/or receiver module 250 (e.g., an Rx PIC). In some implementations, transmitter module 210 may be optically connected to receiver module 250 via link 222, and/or optical amplifiers 230. Link 222 may include one or more optical amplifiers 230 that amplify an optical signal as the optical signal is transmitted over link 222.

Transmitter module 210 may include a number of optical transmitters 212-1 through 212-P (P>1), waveguides 213, and/or optical multiplexer 214. Each optical transmitter 212 may receive a data channel (TxCh1 through TxChN), modulate the data channel with an optical signal, and transmit the data channel as an optical signal. In some implementations, transmitter module 210 may include 5, 10, 20, 50, 100, or some other number of optical transmitters 212. Each optical transmitter 212 may be tuned to use an optical carrier of a designated wavelength. It may be desirable that the grid of wavelengths emitted by optical transmitters 212 conform to a known standard, such as a standard published by the Telecommunication Standardization Sector (ITU-T).

Waveguides 213 may include optical links to transmit modulated outputs (referred to as "signal channels") of optical transmitters 212. In some implementations, each optical transmitter 212 may connect to one waveguide 213 or to multiple waveguides 213 to transmit signal channels of optical transmitters 212 to optical multiplexer 214. In some implementations, waveguides 213 may be made from a birefringent material and/or some other material.

Optical multiplexer 214 may include an arrayed waveguide grating (AWG) or some other multiplexing device. In some implementations, optical multiplexer 214 may combine multiple signal channels, associated with optical transmitters 212, into a wave division multiplexed (WDM) signal, such as optical signal 225.

As further shown in FIG. 2, receiver module 250 may include optical demultiplexer 251, waveguides 252, and/or optical receivers 253-1 through 253-0 (O>1). In some implementations, optical demultiplexer 251 may include an AWG or some other device. Optical demultiplexer 251 may supply multiple signal channels based on a received WDM signal (e.g., optical signal 225). As shown in FIG. 2A, optical demultiplexer 251 may supply signal channels to optical receivers 253 via waveguides 252.

Waveguides 252 may include optical links to transmit outputs of optical demultiplexer 251 to optical receivers 253. In some implementations, each optical receiver 253 may receive outputs via a single waveguide 252 or via multiple waveguides 252. In some implementations, waveguides 252 may be made from a birefringent material and/or some other kind of material.

Optical receivers 253 may each operate to convert an input optical signal to an electrical signal that represents the transmitted data. In some implementations, optical receivers 253 may each include one or more photodetectors and/or related devices to receive respective input optical signals outputted by optical demultiplexer 251 and a local oscillator, convert the signals to a photocurrent, and provide a voltage output to function as an electrical signal representation of the original input signal.

The number of devices and networks shown in FIG. 2 is provided for explanatory purposes. In practice, there may be additional devices and/or networks, fewer devices and/or networks, different devices and/or networks, or differently arranged devices and/or networks than those shown in FIG. 2. Furthermore, two or more of the devices shown in FIG. 2 may be implemented within a single device, or a single device shown in FIG. 2 may be implemented as multiple, distributed devices. Additionally, one or more of the devices of network 200 may perform one or more functions described as being performed by another one or more of the devices of network 200.

Figure 3:
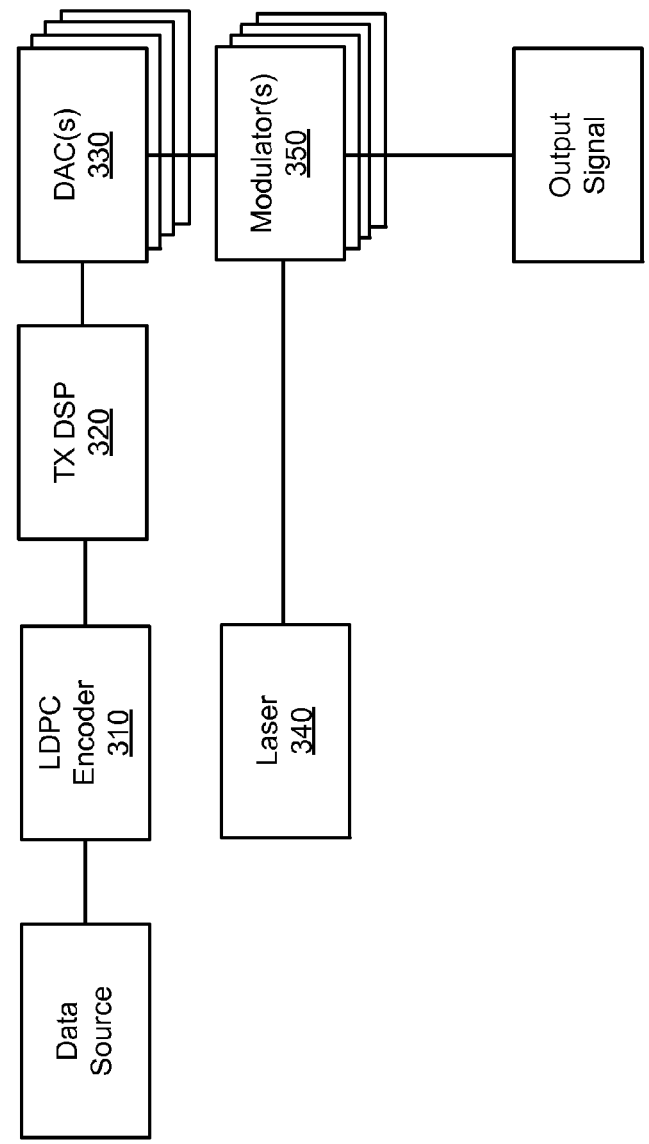
FIG. 3 is a diagram of example components of an optical transmitter shown in FIG. 2.

FIG. 3 is a diagram of example components of an optical transmitter 212 shown in network 200 of FIG. 2. As shown in FIG. 3, optical transmitter 212 may include an LDPC encoder 310, a Tx DSP 320, one or more digital-to-analog convertors (DACs) 330, a laser 340, and one or more modulators 350. In some implementations, LDPC encoder 310, Tx DSP 320, DACs 330, laser 340, and/or modulators 350 may be implemented on one or more integrated circuits, such as one or more PICs, one or more application specific integrated circuits (ASICs), or the like. In some implementations, components of multiple optical transmitters 212 may be implemented on a single integrated circuit, such as a single PIC, to form a super-channel transmitter.

LDPC encoder 310 may include a digital encoding device, or a collection of digital encoding devices. In some implementations, LDPC encoder 310 may receive input data, and may encode bits, associated with the input data, to control or reduce errors in the transmission of the bits. In some implementations, LDPC encoder 310 may encode the bits using an LDPC block code, an LDPC convolutional code, and/or some other LDPC code or technique. An LDPC decoder, in optical receiver 253, may decode the bits coded by LDPC encoder 310, as described below. In some implementations, LDCP encoder 310 may be included in Tx DSP 320.

Tx DSP 320 may include a digital signal processor or a collection of digital signal processors. In some implementations, Tx DSP 320 may receive data from a data source (e.g., a signal received via a Tx channel), process the signal, and output digital signals having symbols that represent components of the signal (e.g., an in-phase x-pol component, a quadrature x-pol component, an in-phase y-pol component, and a quadrature y-pol component). In some implementations, Tx DSP 320 may include one or more other components, such as an interleaver component, a frame header insertion component, a symbol mapper component, and/or a pilot insertion component.

DAC 330 may include a signal converting device or a collection of signal converting devices. In some implementations, DAC 330 may receive respective digital signals from Tx DSP 320, may convert the received digital signals to analog signals, and may provide the analog signals to modulator 350. The analog signals may correspond to electrical signals (e.g., voltage signals) to drive modulator 350. In some implementations, transmitter module 212 may include multiple DACs 330, where a particular DAC 330 may correspond to a particular polarization (e.g., an x-polarization, a y-polarization) of a signal and/or a particular component of a signal (e.g., an in-phase component, a quadrature component).

Laser 340 may include a semiconductor laser, such as a distributed feedback (DFB) laser, or some other type of laser. Laser 340 may provide an output optical light beam to modulator 350.

Modulator 350 may include a Mach-Zehnder modulator (MZM), such as a nested MZM, or another type of modulator. Modulator 350 may receive the optical light beam from laser 340 and the voltage signals from DAC 330, and may modulate the optical light beam, based on the voltage signals, to generate a multiple sub-carrier output signal, which may be provided to multiplexer 214.

In some implementations, optical transmitter 212 may include multiple modulators 350, which may be used to modulate signals of different polarizations. For example, an optical splitter may receive an optical light beam from laser 340, and may split the optical light beam into two branches: one for a first polarization (e.g., an x-polarization) and one for a second polarization (e.g., the y-polarization). The splitter may output one optical light beam to a first modulator 350, which may be used to modulate signals of the first polarization, and another optical light beam to a second modulator 350, which may be used to modulate signals of the second polarization. In some implementations, two DACs 330 may be associated with each polarization. In these implementations, two DACs 330 may supply voltage signals to the first modulator 350 (e.g., for an in-phase component of the x-polarization and a quadrature component of the x-polarization), and two DACs 330 may supply voltage signals to the second modulator 350 (e.g., for an in-phase component of the y-polarization and a quadrature component of the y-polarization). The outputs of modulators 350 may be combined back together using combiners (e.g., optical multiplexer 214) and polarization multiplexing.

The number and arrangement of components shown in FIG. 3 is provided as an example. In practice, optical transmitter 212 may include additional components, fewer components, different components, or differently arranged components than those shown in FIG. 3. For example, the quantity of DACs 330, lasers 340, and/or modulators 350 may be selected to implement an optical transmitter 212 that is capable of generating polarization diverse signals for transmission on an optical fiber, such as link 222. Additionally, or alternatively, a set of components shown in FIG. 3 may perform one or more functions described herein as being performed by another set of components shown in FIG. 3.

Figure 4:
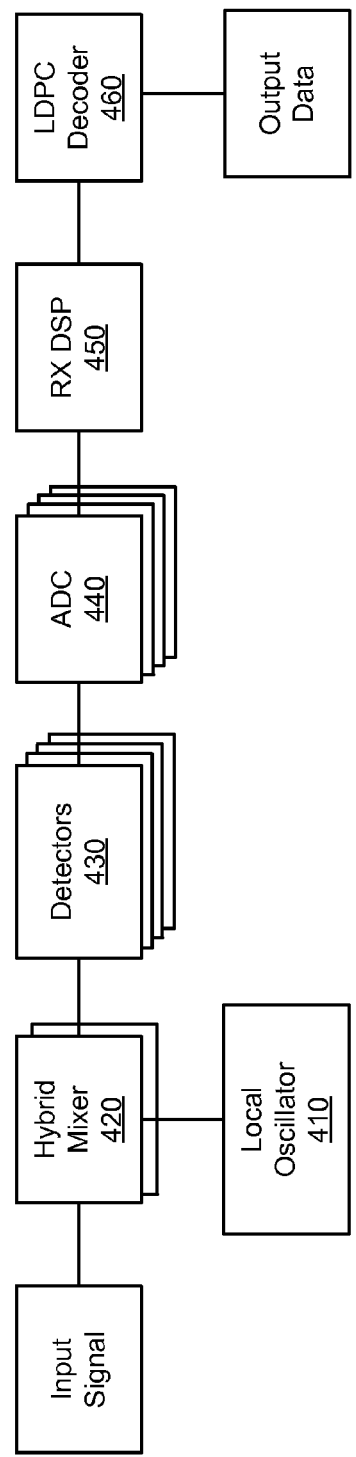
FIG. 4 is a diagram of example components of an optical receiver shown in FIG. 2.

FIG. 4 is a diagram of example components of an optical receiver 253 as shown in network 200 of FIG. 2. As shown in FIG. 4, optical receiver 253 may include a local oscillator 410, a hybrid mixer 420, detectors 430, analog-to-digital converters (ADCs) 440, an Rx DSP 450, and an LDPC decoder 460. In some implementations, local oscillator 410, hybrid mixer 420, and detectors 430 may be implemented on a single integrated circuit, such as a single PIC. In some implementations, ADC 440, Rx DSP 450, and/or LDPC decoder 460 may be implemented using an ASIC. In some other implementations, local oscillator 410, hybrid mixer 420, and/or detectors 430 may be implemented on one or more PICs.

Local oscillator 410 may include a laser device. In some implementations, local oscillator 410 may provide a reference signal to hybrid mixer 420. In some implementations, local oscillator 410 may include a single-sided laser to provide an optical signal to hybrid mixer 420. In some other implementations, local oscillator 410 may include a double-sided laser to provide multiple optical signals to multiple hybrid mixers 420. In some implementations, a phase, intensity, and/or amplitude of the reference signal may be compared to a phase, intensity, and/or amplitude of an input signal (e.g., a WDM signal supplied by optical demultiplexer 251 and corresponding to an output signal provided by transmitter module 210) to recover data carried by the input signal.

Hybrid mixer 420 may include one or more optical devices to receive an input signal (e.g., a WDM signal supplied by optical demultiplexer 251 and corresponding to an output signal provided by transmitter module 212). In some implementations, hybrid mixer 420 may receive a reference signal from local oscillator 410. In some implementations, hybrid mixer 420 may supply components associated with the input signal and the reference optical signal to detectors 430. For example, hybrid mixer 420 may supply an in-phase x-pol component, a quadrature x-pol component, an in-phase y-pol component, and a quadrature y-pol component. In some implementations, a first hybrid mixer 420 may provide the in-phase x-pol component and the quadrature x-pol component, and a second hybrid mixer 420 may provide the in-phase y-pol component and the quadrature y-pol component.

Detector 430 may include one or more photodetectors, such as a photodiode, to receive the output optical signal, from hybrid mixer 420, and convert the output optical signal to corresponding voltage signals. In some implementation, optical receiver 253 may include multiple detectors 430 for in-phase x-pol components, quadrature x-pol components, in-phase y-pol components, and quadrature y-pol components. In some implementations, detectors 430 may include one or more balanced pairs of photodetectors. For example, detectors 430 may include a first pair of photodetectors to receive an in-phase x-pol component, and a second pair of photodetectors to receive a quadrature x-pol component. Additionally, detectors 430 may include a third pair of photodetectors to receive an in-phase y-pol component, and a fourth pair of photodetectors to receive a quadrature y-pol component.

ADC 440 may include an analog-to-digital converter that converts the voltage signals from detector 430 to digital signals. ADC 440 may provide the digital signals to Rx DSP 450. In some implementations, optical receiver 253 may include four ADCs 440 or some other number of ADCs 440 (e.g., one ADC 440 for each electrical signal output by detectors 430).

Rx DSP 450 may include a digital signal processing device or a collection of digital signal processing devices. In some implementations, Rx DSP 450 may receive digital signals from ADCs 440 and may process the digital signals to form output data associated with the input signal received by hybrid mixer 420. In some implementations, Rx DSP 450 may include one or more other components, such as a carrier recovery component, a pilot phase estimate component, a decoder component, a frame header strip component, and/or a de-interleaver component.

LDPC decoder 460 may include a digital decoding device, or a collection of digital decoding devices. In some implementations, LDPC decoder 460 may receive grouped bits from Rx DSP 450 (e.g., a de-interleaver component of Rx DSP 450) and decode the bits using an LDPC block code, an LDPC convolutional code, and/or some other LDPC code or technique. In some implementations, LDPC decoder 460 may decode the bits to form recovered output data corresponding to input data provided to optical transmitter 212. In some implementations, LDPC decoder may include one or more shift registers, as described below. In some implementations, LDCP decoder 460 may be included in Rx DSP 450.

While FIG. 4 shows optical receiver 253 as including a particular quantity and arrangement of components, in some implementations, optical receiver 253 may include additional components, fewer components, different components, or differently arranged components.

Figure 5A:
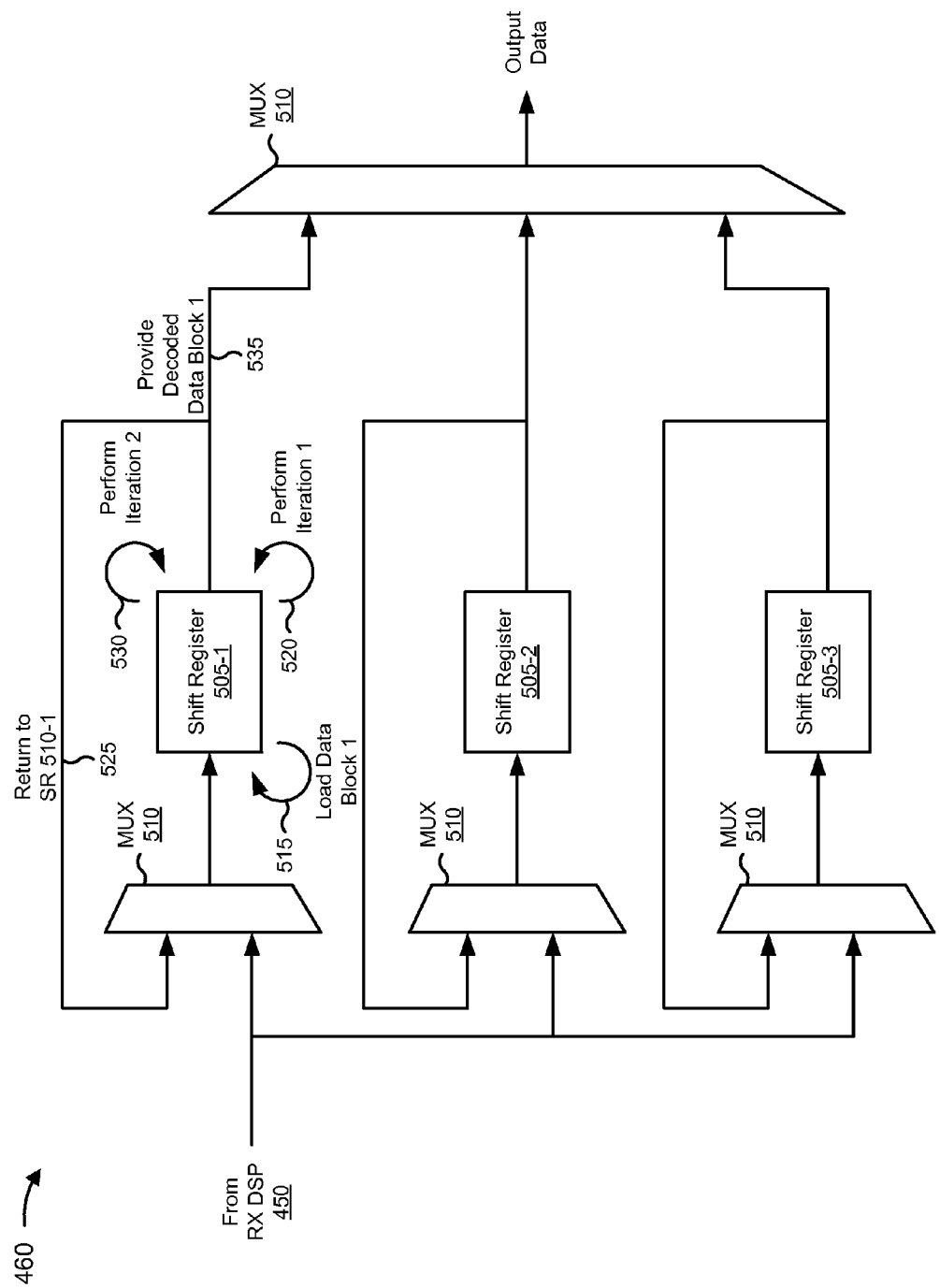
FIGS. 5A and 5B are diagrams of example components of an LDPC decoder, shown in FIG. 4, constructed using a set of shift registers.
Figure 5B:
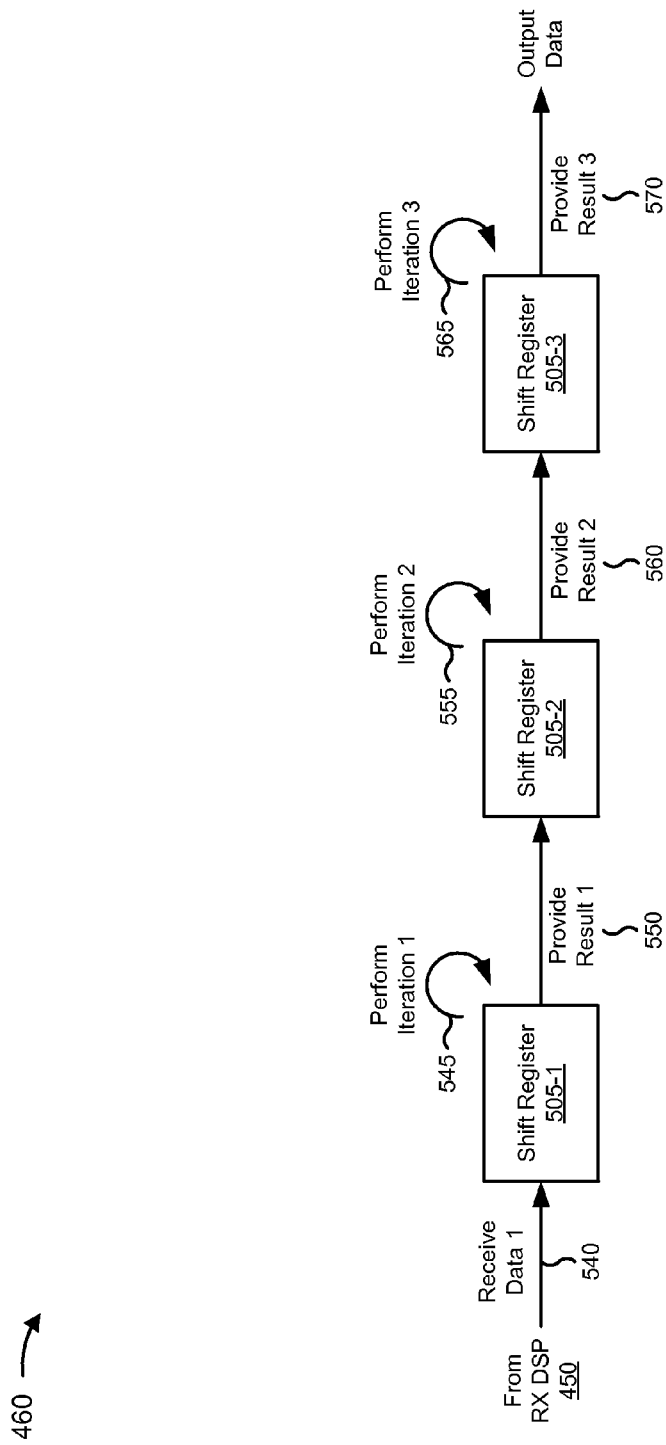

FIGS. 5A and 5B are diagrams of example components of LDPC decoder 460, shown in FIG. 4, constructed using a set of shift registers. FIG. 5A describes an LDPC decoder implemented using a group of shift registers to decode an LDPC block code.

As shown in FIG. 5A, LDPC decoder 460, when implemented using a group of shift registers to decode an LDPC block code, may include one or more shift registers 505, and one or more multiplexers 510.

Shift register 505 may include a structure associated with decoding LDPC coded data received by LDPC decoder 460. For example, shift register 505 may include a cascade of flip flops corresponding to a group of storage elements and/or a group of check node elements associated with decoding the LDPC coded data. In some implementations, shift register 505 may include a group of K shift register lanes, and each shift register lane may include multiple storage elements (e.g., where K corresponds to the quantity of K data words, associated with the LDPC code, received by shift register 505 at each shift register clock cycle). Additionally, or alternatively, shift register 505 may include a group of N shift register stages, where N corresponds to the number of shift register stages required to perform one iteration of decoding the K data words included in the LDPC coded data. Additionally, or alternatively, shift register 505 may include J check node elements, where J corresponds to a quantity of check node functions associated with decoding the LDPC coded data.

In some implementations, shift register 505 may be configured such that a set of K data words, included in the LDPC coded data, is loaded into a first set of storage elements associated with a first stage (e.g., stage 0) of the N stages of shift register 505. The K data words may then be shifted through shift register 505 at each clock cycle of the shift register (e.g., from stage 0 to stage 1, from stage 1 to stage 2, etc.), until the data words exit the shift register (e.g., after stage N-1). In some implementations, each of the K data words may be modified, altered, updated, etc. once by each of the J check node elements, included in the shift register, as the K data words pass through shift register 505.

In some implementations, a data word may be passed from a first storage element to a second storage element (e.g., when the data word is not being updated by a check node element) as the data word is passed through shift register 505. Additionally, or alternatively, the data word may be passed from a storage element to a check node element (e.g., when the data word is to be updated by the check node element) as the data word is passed through shift register 505. Additionally, or alternatively, the data word may be passed from a check node element to a storage element (e.g., after the data word has been updated by the check node element) as the data word is passed through shift register 505. In some implementations, each of the J check node elements may be connected to each of the K shift register lanes throughout shift register 505, such that each of the J check node elements may update each of the K data words one time as the K data words are passed through shift register 505. In some implementations, each of the J check node elements may be connected to a storage element from each of the K shift register lanes, but only one storage element from any of the N shift register stages. Additionally, or alternatively, a data word passing through one of the K shift register lanes may be modified by each check node element one time as the data word passes through shift register 505, but the data word may not be modified by more the one of the J check node elements at a given stage of shift register 505. In this manner, over the course of the N stages of shift register 505, each of the K data words may be updated J times (e.g., each of the K data words may be updated once by each of the J check node elements included in shift register 505).

Multiplexer 510 may include a device capable of selecting an input signal, of a group of one or more input signals, and outputting the selected signal to shift register 505. For example, multiplexer 510 may be configured to receive a first input signal (e.g., including LDPC coded data) from Rx DSP 450, and may be configured to receive a second input signal (e.g., including partially decoded LDPC coded data)

from shift register 505. In this example, multiplexer 510 may output the first signal or the second signal.

FIG. 5A shows an example implementation of LDPC decoder 460, including three shift registers 505 (e.g., shift register 505-1 through 505-3) and four multiplexers 510, for a two iteration LDPC block code decoder. In this example implementation, decoding an LDPC block code may be performed as follows.

As shown by reference number 515, a block of LDPC coded data (e.g., data block 1), including a set of data words, may be loaded into shift register 505-1. As shown by reference number 520, data block 1 may pass through shift register 505-1 in order to perform a first iteration (e.g., in the manner described above with respect to shift register 505) of decoding data block 1. As shown by reference number 525, the partially data block 1 may then return to shift register 505-1 (e.g., via the feedback path, including multiplexer 510, shown in FIG. 5A). As shown by reference number 530, the partially decoded data block 1 may pass through shift register 505-1 in order to perform a second iteration of decoding data block 1. As shown by reference number 535, the fully decoded data block 1 may shift out of shift register 505-1 as another block of data is loaded into shift register 505-1. This process may then be repeated for the other block of data. In this way, two iterations of decoding a block of LDPC coded data may be performed by shift register 505-1.

Additionally, with respect to FIG. 5A, while the first iteration of decoding data block 1 is being performed by shift register 505-1, a second block of data (e.g., data block 2) may be loaded into shift register 505-2. Similarly, while the second iteration of decoding data block 1 is being performed by shift register 505-1, the first iteration of decoding data block 2 may be performed by shift register 505-2 and a third block of data (e.g., data block 3) may be loaded into shift register 505-3. After the second iteration of decoding data block 1 is performed, as described above, the fully decoded data block 1 may be provided as output while another block of data (e.g., data block 4) is loaded into shift register 505-1. In this way, an input bus, associated with LDPC decoder 460, may be fully utilized.

In some implementations, the quantity of shift registers 505 included in LDPC decoder 460 may be based on the number of iterations to be performed by each shift register 505-1 (e.g., when LDPC decoder 460 is configured to decode and provide LDPC block coded data at the same rate at which data is received by LDPC decoder 460, the quantity of shift registers required may be based on the number of iterations to be performed by each shift register). Additionally, or alternatively, the quantity of shift registers 505 included may be based on a clock rate associated with each shift register 505 (e.g., when shift register 505 is configured to decode and provide data at a rate faster than a rate at which LDPC coded data is received, the quantity of required shift registers 505 may be less than the number of iterations). Additionally, or alternatively, the quantity of shift registers 505 may be determined in another manner.

FIG. 5B describes an LDPC decoder implemented using a group of shift registers to decode an LDPC convolutional code. As shown in FIG. 5B, LDPC decoder 460, when implemented using a group of shift registers to decode an LDPC convolutional code, may include one or more shift registers 505. Shift register 505 may include a shift register similar to that described above with regard to FIG. 5A.

FIG. 5B shows an example implementation of LDPC decoder 460 that includes three shift registers 505 (e.g., shift register 505-1 through 505-3) for a three iteration LDPC convolutional code decoder. In this example implementation, decoding an LDPC convolutional code may be performed as described below.

As shown by reference number 540, a first portion of LDPC coded data (e.g., data 1) may be received by shift register 505-1. As shown by reference number 545, shift register 505-1 may perform a first iteration of decoding data 1, and, as shown by reference number 550, shift register 505-1 may provide the a result of the first iteration of decoding to shift register 505-2. As shown by reference number 555, shift register 505-2 may perform a second iteration of decoding (e.g., on the result of the first iteration of decoding data 1), and, as shown by reference number 560, may provide a result of the second iteration to shift register 505-3. As shown by reference number 565, shift register 505-3 may perform a third iteration of decoding (e.g., on the result of the second iteration of decoding data 1), and, as shown by reference number 570, may provide a result of the third iteration of decoding as output data. In some implementations, LDPC decoder 460 may continuously decode portions of LDPC coded data. For example, LPDC decoder 460 (e.g., shift register 505-1) may perform a first iteration of decoding a third portion of LDPC coded data while LDPC decoder 460 (e.g., shift register 505-2) is performing a second iteration of decoding a second portion of LDPC coded data and while LDPC decoder 460 (e.g., shift register 505-3) is performing a third iteration of decoding a first portion of LDPC coded data. In this way, LDPC decoder 460 may implement a group of shift registers 505 in order to decode LDPC convolutional coded data as the LDPC convolutional coded data is received by LDPC decoder 460.

While FIGS. 5A and 5B show LDPC decoder 460 as including a particular quantity and arrangement of shift registers 505 and/or other components for decoding LDPC block coded data and LDPC convolutional coded data, in some implementations, LDPC decoder 460 may include additional shift registers 505 and/or other components, fewer shift registers 505 and/or other components, different shift registers 505 and/or other components, or differently arranged shift registers 505 and/or other components.

Figure 6A:
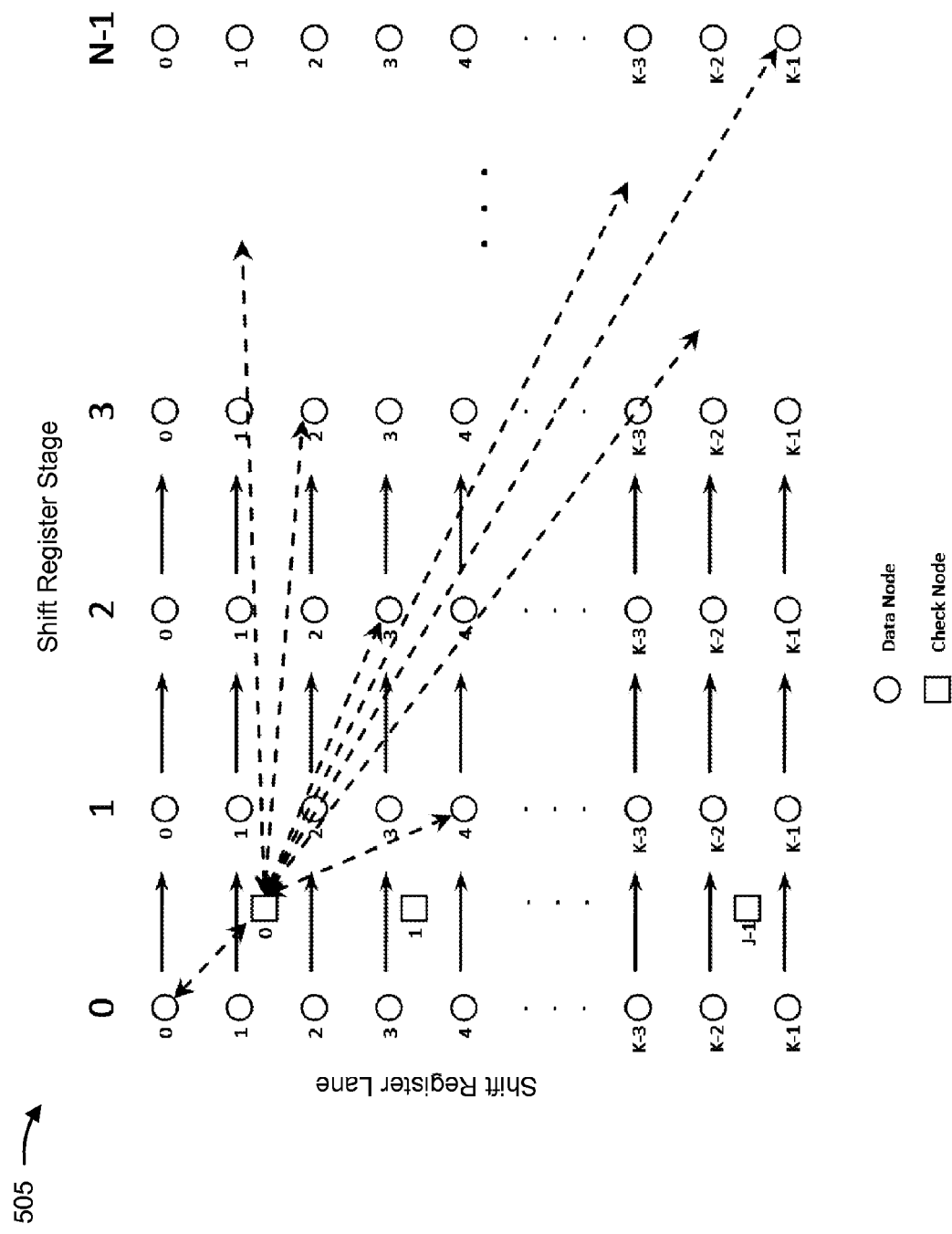
FIGS. 6A and 6B are diagrams of an ideal shift register and a practical shift register associated with performing an iteration of decoding LDPC coded data.
Figure 6B:
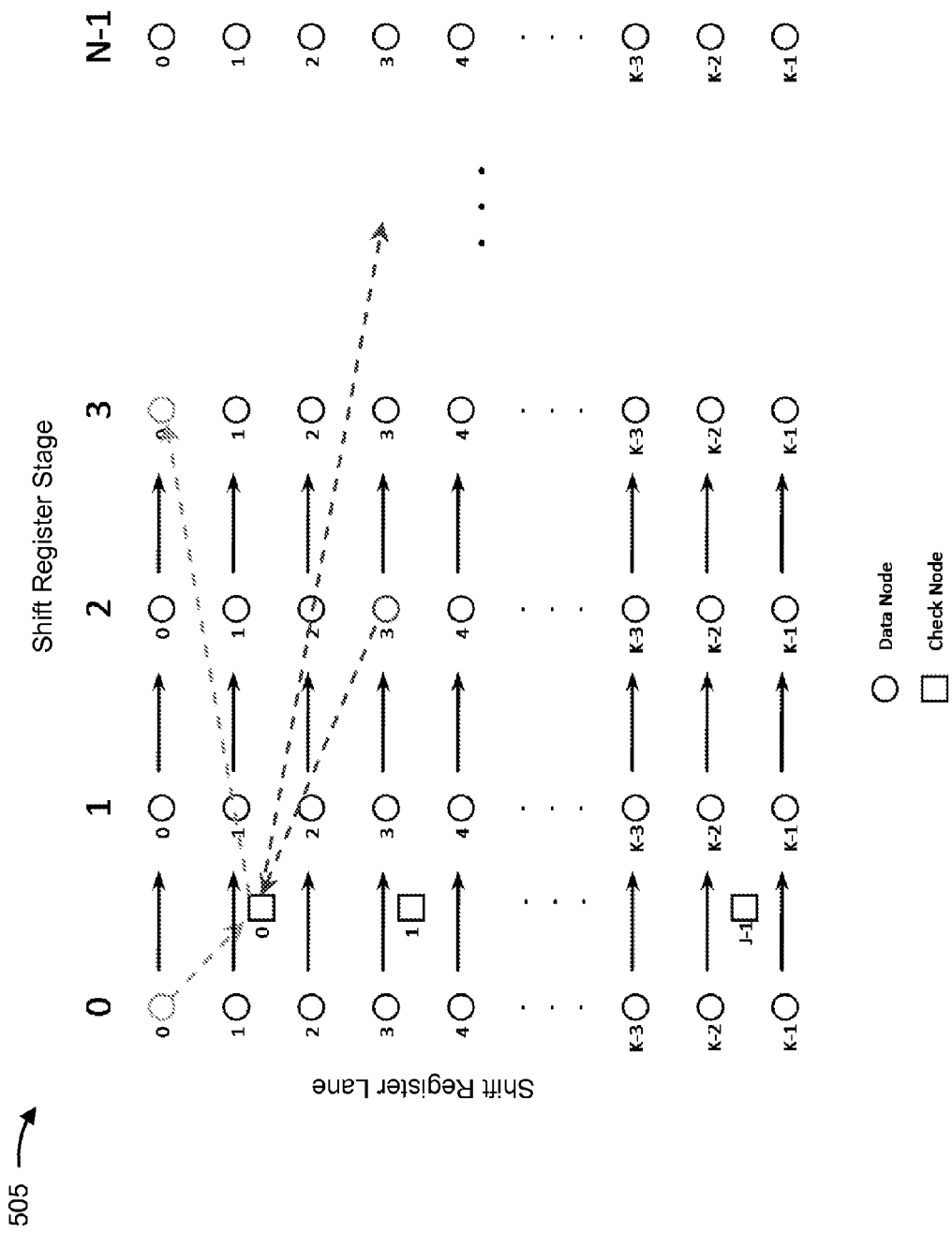

FIGS. 6A and 6B are diagrams of an ideal shift register 505 and a practical shift register 505 associated with performing an iteration of decoding LDPC coded data. For the purposes of FIG. 6A and 6B, assume that shift register 505 includes K shift register lanes (e.g., 0 through K-1) and N shift register stages (e.g., 0 through N-1) associated with performing one iteration of decoding LDPC coded data.

As shown in FIG. 6A, an ideal shift register 505 (e.g., with check node elements included in shift register 505) may be capable of updating LDPC coded data passing through shift register 505 in zero-time (e.g., instantaneously). For example, as shown in FIG. 6A, at a given clock cycle, check node element 0 may be configured (e.g., based on the LDPC code) to update a data word in lane 0 at stage 0, a data word in lane 2 at stage 3, a data word in lane 3 at stage 2, a data word in lane 4 at stage 1, etc. In FIG. 6A, since the data word updates may be performed in zero time, check node element 0 may read the data words from each storage element, may update the data words, and may provide the updated data words back to the same the storage element from which the data words were read. The data words may proceed through shift register 505 as described above. However, in practice the check node elements may not be capable of updating the data word in zero time.

As shown in FIG. 6B, in a practical shift register 505, check node element 0 may not be capable of performing the data word updates in zero time. For example, check node element 0 may receive the lane 0 data word from the storage element in lane 0 at stage 0, two clock cycles may pass while check node element 0 updates the lane 0 data word, and check node element 0 may provide the updated lane 0 data word to the storage element at lane 0 in stage 3 (e.g., since check node element 0 was updating the lane 0 data word during stage 1 and stage 2). At the same time, check node element 0 may receive the lane 3 data word from the storage element in lane 3 at stage 2, two clock cycles may pass while check node element 0 updates the lane 3 data word, and check node element 0 may provide the updated lane 3 data word to the storage element in lane 3 at stage 5 (e.g., not shown). In this example, the stage 1 storage element in lane 0, the stage 2 storage element in lane 0, the stage 3 storage element in lane 3, and the stage 4 storage element in lane 3 may be displaced by check node element 0. In other words, check node element 0 may essentially function as a storage element for lane 0 during stage 1 and stage 2, and for lane 3 during stage 3 and stage 4. As such, the storage elements displaced by check node element 0 need not be included in shift register 505. In some implementations, multiple check node elements may displace multiple storage elements within shift register 505 (e.g., such that the storage requirement for shift register 505 is reduced).

As indicated above, FIGS. 6A and 6B is provided merely as an example. Other examples are possible and may differ from what was described with regard to FIGS. 6A and 6B.

Figure 7:
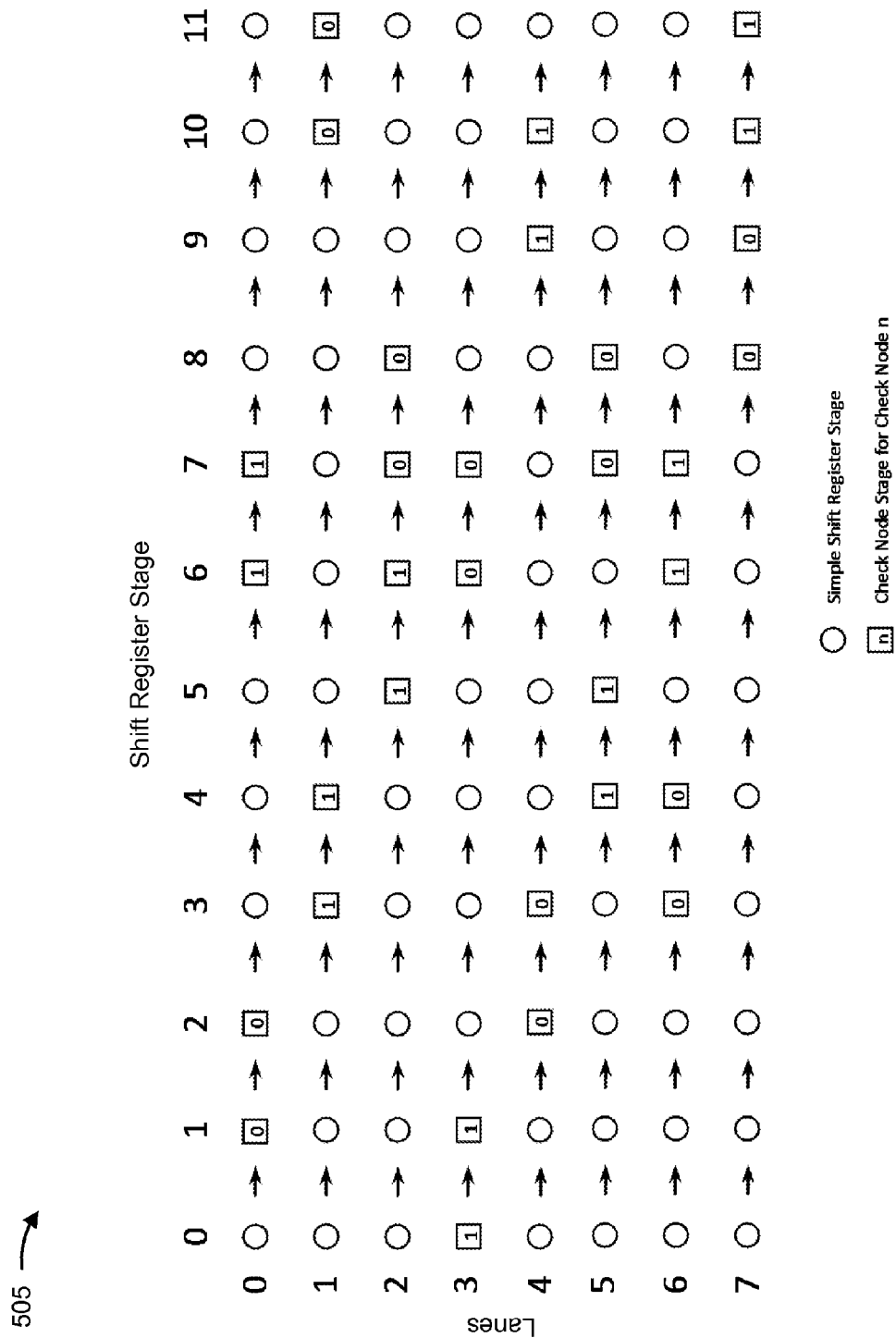
FIG. 7 is a diagram of an example implementation relating to the example shift register structure shown in FIG. 6B.

FIG. 7 is a diagram of an example implementation 700 relating to the example shift register structure shown in FIG. 6B. For the purposes example implementation 700, assume that LDPC decoder 460 includes shift register 505 that includes 12 stages (e.g., stage 0 through stage 11), and eight lanes (e.g., lane 0 through lane 7). Further, assume that two check node elements (e.g., check node element 0 and check node element 1) are configured to update LDPC coded data words passing through shift register 505 in order to perform one iteration of decoding the LDPC coded data.

As shown in FIG. 7, at a particular clock cycle, eight data words may be loaded into shift register 505 (e.g., into corresponding lanes) at stage 0. As shown, at the particular clock cycle, a data word in lane 3 may be provided directly to check node element 1 (e.g., rather than a storage element), and check node element 1 may begin updating the lane 3 data word. At the same time, check node element 1 may also begin updating data words shifting to stage 6 in lane 0, stage 3 in lane 1, stage 5 in lane 2, stage 9 in lane 4, stage 4 in lane 5, stage 6 in lane 6, stage 10 in lane 7. Similarly, check node element 0 may begin updating data words shifting to stage 1 in lane 0, stage 10 in lane 1, stage 7 in lane 2, stage 6 in lane 3, stage 2 in lane 4, stage 7 in lane 5, stage 3 in lance 6, and stage 8 in lane 7. As shown, check node element 1 and check node element 0 may require two clock cycles (e.g., two stages) to update data words in each lane. For example, check node element 0 may update the lane 0 data word during stage 1 and stage 2, before providing the updated lane 0 data word to a storage element in lane 0 at stage 3. In this way, check node element 0 and check node element 1 may displace the need for multiple storage elements within shift register structure 505. In FIG. 7, check node element 0 and check node element 1 displace 32 of 96 (e.g., 33.33%) of storage elements in shift register 505 (e.g., such that the storage requirement for shift register 505 is decreased by 33.33%).

In some implementations, and depending on one or more parameters (e.g., a number of stages, a number of check node elements, a check node element latency, etc.) of the LPDC code decoded by LDPC decoder 460, the amount of storage displaced by the check node elements may be different. For example, a high bandwidth application, associated with LDPC decoder 460, that requires a high degree of parallelization may reduce the number of shift register stages and increase the number of check node elements associated with the LDPC code. In this example, the check node elements may displace a higher percentage of storage elements within shift register 505.

Additionally, while implementing large shift registers 505 with flip flops may be costly from a gate count and/or a power usage perspective, this approach may be implemented rather than a RAM based implementation in a case where LDPC decoder 460 would require a large number of small RAMs (e.g., which may result in inefficient power usage etc.). In some implementations, shift register 505 may be implemented using a first-in, first-out (FIFO) implementation to avoid unnecessary signal toggling and to further reduce power usage.

As indicated above, FIG. 7 is provided merely as an example. Other examples are possible and may differ from what was described with regard to FIG. 7.

Implementations described herein may provide an LDPC decoder using a group of shift registers (e.g., rather than separate check node elements and storage elements), such that a check node element, associated with implementing a check node function, may displace (i.e., replace the need for) one or more storage elements associated with the LDPC coded data being updated by the check node element. In this manner, an amount of required data storage, a gate count, and/or an amount of power required by the LDPC decoder, when decoding the LDPC coded data, may be reduced (e.g., as compared to a traditional LDPC decoder).

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A low-density parity-check (LDPC) decoder, included in a receiver, comprising:
a shift register configured to:
receive LDPC coded data;
perform an iteration associated with decoding the LDPC coded data; and
provide a result of performing the iteration associated with decoding the LDPC coded data;
where the shift register includes:
a quantity of lanes corresponding to a quantity of data words received by the shift register at a particular clock cycle;
a quantity of stages corresponding to a quantity of clock cycles needed to perform the iteration associated with decoding the LDPC coded data; and
a quantity of storage elements, associated with storing the data words during the iteration, and a set of check node elements associated with updating the data words during the iteration,
a value of the quantity of stages times a value of the quantity of lanes being greater than a value of the quantity of storage elements by a value representing a particular number of storage elements,
the particular number of storage elements being displaced by the set of check node elements.

2. The LDPC decoder of claim 1, where the shift register, when performing the iteration associated with decoding the LDPC coded data, is to:
cause each data word, of the quantity of data words, to be modified one time by each check node element of the set of check node elements.

3. The LDPC decoder of claim 1, where the shift register is configured such that:
each check node element, of the set of check node elements, is connected to a corresponding storage element, of the quantity of storage elements, in each lane of the quantity of lanes.

4. The LDPC decoder of claim 1, where the shift register is configured such that:
a data word, of the quantity of data words, is not being updated by more than one check node element, of the set of check node elements, at a particular stage of the quantity of stages.

5. The LDPC decoder of claim 1, where the shift register is configured such that:
a check node element, of the set of check node elements, does not update a data word, associated with a lane of the quantity of lanes, while another check node element, of the set of check node elements, is updating the data word associated with the lane.

6. The LDPC decoder of claim 1, where the LDPC coded data is associated with an LDPC block code.

7. The LDPC decoder of claim 1, where the LDPC coded data is associated with an LDPC convolutional code.

8. A low-density parity-check (LDPC) decoder comprising, a set of shift registers configured to:
receive LDPC coded data;
decode the LDPC coded data to create output data, each shift register, of the set of shift registers, performing at least one iteration associated with decoding the LDPC coded data; and
provide the output data;
where each shift register, of the set of the shift registers, includes:
a quantity of lanes corresponding to a quantity of data words received by the shift register at a particular clock cycle;
a quantity of stages corresponding to a quantity of clock cycles needed to perform an iteration associated with decoding the LDPC coded data;
a quantity of storage elements, associated with storing the data words during the iteration, and a set of check node functions associated with updating data words during the iteration;
a value of the quantity of storage elements being less than a value of the quantity of stages times a value of the quantity of lanes by a value representing a particular number of storage elements,
the particular number of storage elements being displaced by the set of check node functions.

9. The LDPC decoder of claim 8, where each shift register, of the set of shift registers, when performing the at least one iteration associated with decoding the LDPC coded data, is to:
cause each data word, of the quantity of data words, to be modified one time by each check node function of the set of check node functions,
each data word being modified one time by each check node function.

10. The LDPC decoder of claim 8, where each shift register, of the set of shift registers, is configured such that:
each check node function, of the set of check node functions, is connected to a corresponding storage element, of the quantity of storage elements, in each lane of the quantity of lanes.

11. The LDPC decoder of claim 8, where each shift register, of the set of shift registers, is configured such that:
a data word, of the quantity of data words, is not being modified by more than one check node function, of the set of check node functions at a particular stage of the quantity of stages.

12. The LDPC decoder of claim 8, where each shift register, of the set of shift registers, is configured such that:
a check node function, of the set of check node functions, does not update a data word, associated with a lane of the quantity of lanes, while another check node function, of the set of check node functions, is updating the data word associated with the lane.

13. The LDPC decoder of claim 8, where the LDPC coded data is associated with an LDPC block code.

14. The LDPC decoder of claim 8, where the LDPC coded data is associated with an LDPC convolutional code.

15. An optical receiver, including a low-density parity-check (LDPC) decoder, comprising:
a shift register configured to:
receive LDPC coded data;
perform an iteration associated with decoding the LDPC coded data; and
provide a result associated with performing the iteration associated with decoding the LDPC coded data;
where the shift register includes:
a quantity of shift register lanes corresponding to a quantity of data words received by the shift register at a particular time, a quantity of shift register stages corresponding to a quantity of clock cycles associated with performing the iteration associated with decoding the LDPC coded data, and a quantity of storage elements, associated with storing the data words during the iteration, and a group of check node elements associated with updating the data words during the iteration, a value representing the quantity of shift register stages times a value representing the quantity of shift register lanes being greater than a value representing the quantity of storage elements by a value representing a particular number of storage elements, the particular number of storage elements being displaced by the group of check node elements.

16. The optical receiver of claim 15, where the shift register, when performing the iteration associated with decoding the LDPC coded data, is to:

cause each data word, of the quantity of data words, to be modified one time by each check node element of the group of check node elements.

17. The optical receiver of claim 15, where the shift register is configured such that:

each check node element, of the group of check node elements, is connected to a corresponding storage element, of the quantity of storage elements, in each shift register lane of the quantity of shift register lanes.

18. The optical receiver of claim 15, where the shift register is configured such that:

a data word, of the quantity of data words, is not being modified by more than one check node element, of the group of check node elements, at a particular shift register stage of the quantity of shift register stages.

19. The optical receiver of claim 15, where the shift register is configured such that:

a check node element, of the group of check node elements, does not update a data word, associated with a shift register lane of the quantity of shift register lanes, while another check node element, of the group of check node elements, is updating the data word associated with the shift register lane.

20. The optical receiver of claim 15, where the LDPC coded data is associated with an LDPC convolutional code.

\* \* \* \* \*